(12) United States Patent
He et al.

(10) Patent No.: US 11,538,516 B2
(45) Date of Patent: Dec. 27, 2022

(54) COLUMN SELECTOR ARCHITECTURE WITH EDGE MAT OPTIMIZATION

(71) Applicant: Micron Technology, Inc., Boise, ID (US)

(72) Inventors: Yuan He, Boise, ID (US); Hiroshi Akamatsu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/832,097

(22) Filed: Jun. 3, 2022

(65) Prior Publication Data

US 2022/0293163 A1 Sep. 15, 2022

Related U.S. Application Data

(62) Division of application No. 17/084,250, filed on Oct. 29, 2020, now Pat. No. 11,361,814.

(51) Int. Cl.
| | |
|---|---|
| *G11C 11/408* | (2006.01) |
| *G11C 8/18* | (2006.01) |
| *G11C 11/4091* | (2006.01) |
| *G11C 11/406* | (2006.01) |
| *G11C 11/4074* | (2006.01) |

(52) U.S. Cl.
CPC ............ *G11C 11/4087* (2013.01); *G11C 8/18* (2013.01); *G11C 11/4074* (2013.01); *G11C 11/4091* (2013.01); *G11C 11/40603* (2013.01)

(58) Field of Classification Search
CPC .......... G11C 11/4087; G11C 11/40603; G11C 11/4091; G11C 11/4076; G11C 11/4074; G11C 11/4097; G11C 11/4093; G11C 8/18; G11C 8/12; G11C 29/022; G11C 29/028; G11C 5/025
See application file for complete search history.

(56) References Cited

U.S. PATENT DOCUMENTS

| | | | |
|---|---|---|---|
| 6,067,260 A | 5/2000 | Ooishi et al. | |
| 6,728,160 B1 | 4/2004 | Yang et al. | |
| 10,497,427 B2 | 12/2019 | Kim et al. | |
| 11,087,827 B1 | 8/2021 | He | |
| 2010/0118592 A1* | 5/2010 | Ishihara | G11C 13/0069 365/189.011 |
| 2019/0333555 A1 | 10/2019 | Yim et al. | |
| 2020/0243154 A1 | 7/2020 | Sity et al. | |

FOREIGN PATENT DOCUMENTS

KR 19990042561 A 6/1999

* cited by examiner

*Primary Examiner* — Sultana Begum
(74) *Attorney, Agent, or Firm* — Fletcher Yoder, P.C.

(57) ABSTRACT

A memory mat architecture is presented where a column decoder is disposed within the memory array. The location of the column decoder reduces a distance between the column decoder and a target memory cell and thus reduces a distance that a column select signal travels from the column decoder to the target memory cell. A single predecoder is disposed in a bank controller for the memory array. The column decoder may be disposed in the middle of the memory array or offset from the middle near the far edge of the memory array opposite the bank controller. The location of the column decoder enables a reduced array access time to obtain data from the target memory cell.

20 Claims, 6 Drawing Sheets

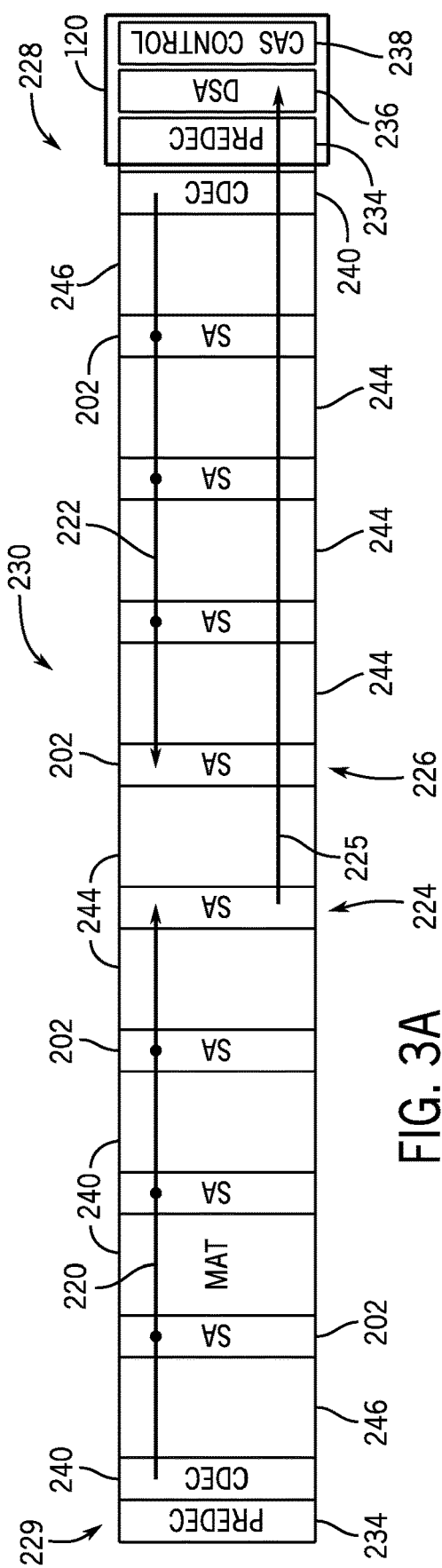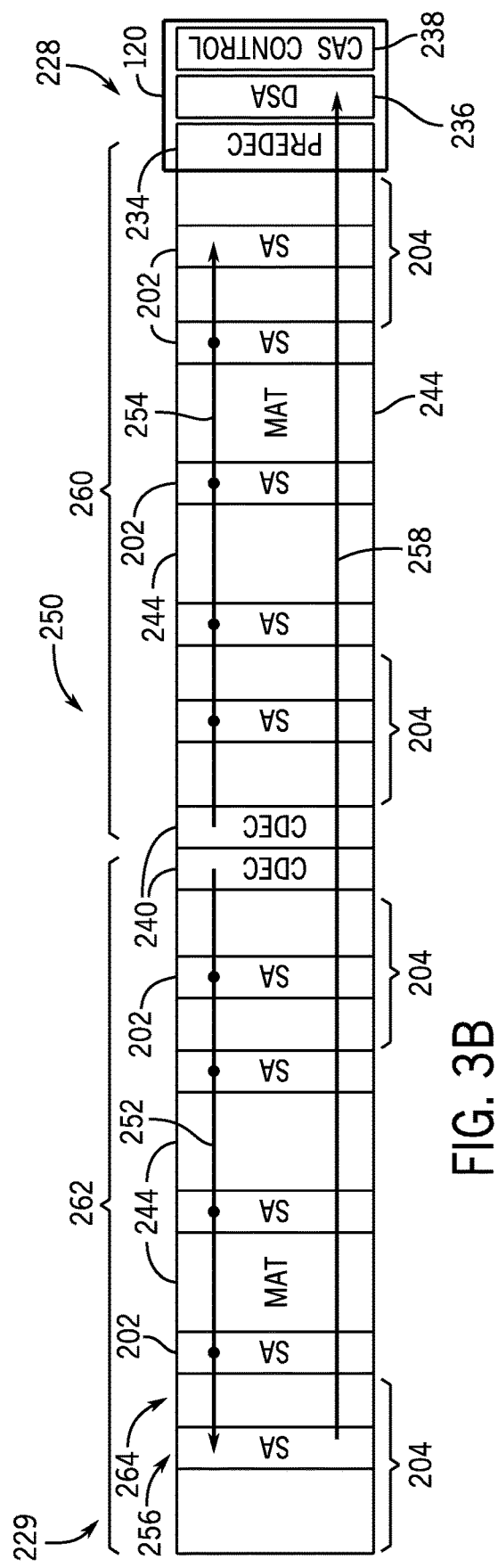
FIG. 3A
FIG. 3B

COLUMN SELECTOR ARCHITECTURE
WITH EDGE MAT OPTIMIZATION

CROSS REFERENCE TO RELATED
APPLICATIONS

This application is a Divisional of U.S. patent application Ser. No. 17/084,250, filed Oct. 29, 2020, and entitled "COLUMN SELECTOR ARCHITECTURE WITH EDGE MAT OPTIMIZATION", which is incorporated herein by reference in its entirety for all purposes.

BACKGROUND

Field of the Present Disclosure

Embodiments of the present disclosure relate generally to the field of semiconductor devices. More specifically, embodiments of the present disclosure relate to memory array architectures.

Description of Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Dynamic random-access memory (DRAM) device arrays include row segment sections with interleaved segments and sense amplifiers coupled to sequential row segments. The edge memory mats may include interleaved digit lines to increase a storage density of the memory array. However, a predecoder and a column decoder are typically disposed at each edge memory mat at either end of the array. That is, the dual predecoder and column decoder may be used to improve an access time of the memory array by reducing a distance between a target memory cell and the column decoder. However, the dual predecoder and column decoder may increase a size of the memory array and/or consume more physical space on the memory array.

Embodiments of the present disclosure may be directed to address one or more of the problems set forth above.

BRIEF DESCRIPTION OF THE DRAWINGS

Various aspects of this disclosure may be better understood upon reading the following detailed description and upon reference to the drawings described below.

FIG. 3A is a schematic block diagram of a column select memory architecture.

FIG. 3B is a schematic block diagram of a column select memory architecture, according to an embodiment of the disclosure.

Figure 1:
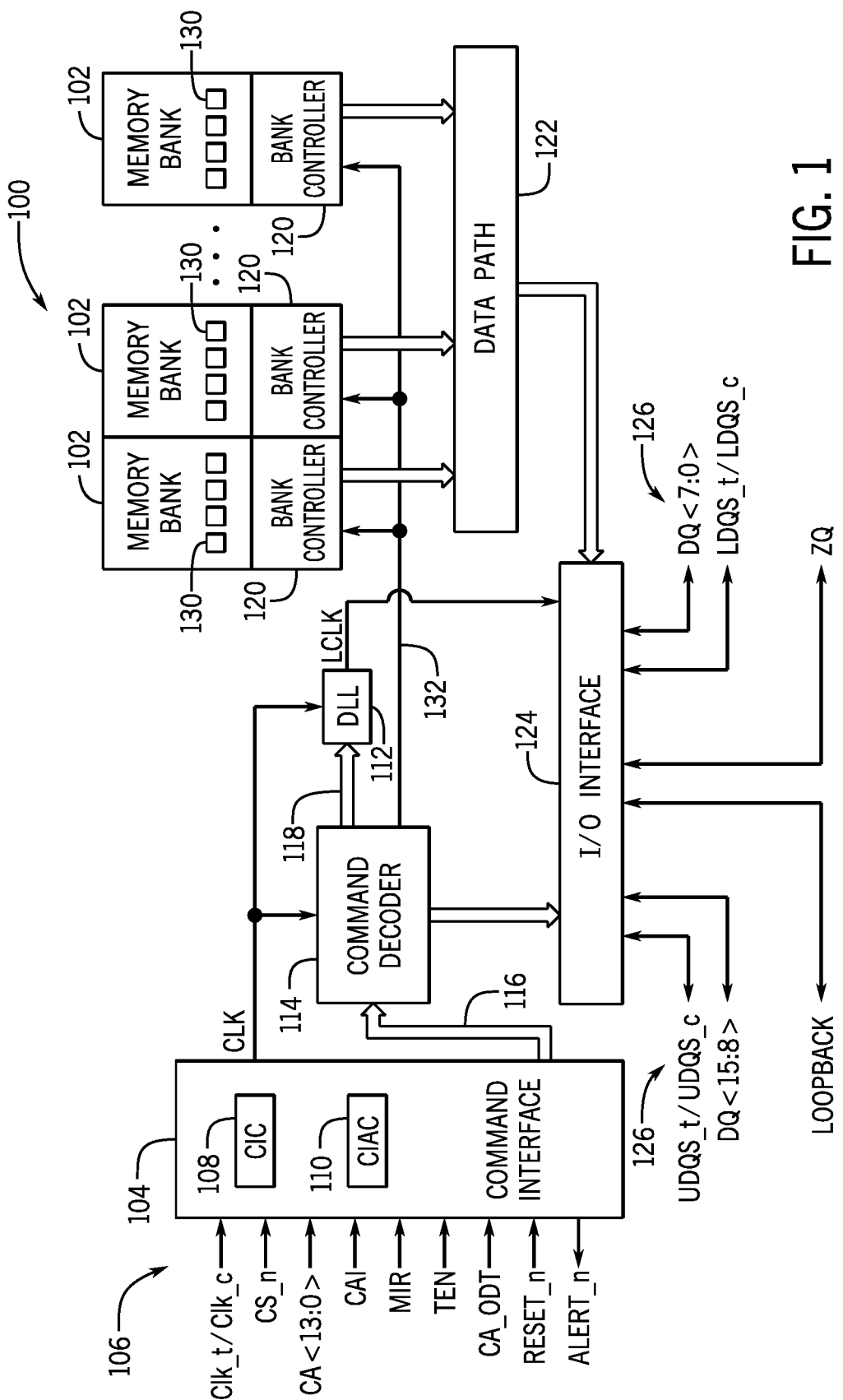
FIG. 1 is a block diagram illustrating some features of a memory device, according to an embodiment of the disclosure.

DETAILED DESCRIPTION OF SPECIFIC
EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices exchange data and store the data in memory banks. Each memory bank may include a plurality of sub-arrays which each include a plurality of memory cells in which data is stored. A subgroup of the sub-arrays may be positioned to form a row of a memory array. Each sub-array of a row may be coupled to a common bank of sense amplifiers and coupled to a common column select line or a common digit line. That is, a bank of sense amplifiers may be disposed in the row of sub-arrays such that the sub arrays alternate with the sense amplifiers. As used herein, a memory mat may include any number of sub-arrays coupled to a common word line, sub-word line driver, or bank of sub-word line drivers. In some embodiments, a memory mat may also be referred to as a "row segment section." As used herein, "edge mat" or "edge memory mat" may refer to a memory mat on an edge of a row of the memory array.

Edge memory mats may include split digit lines which are interleaved. The interleaved digit lines may improve a storage density of the memory array without increasing a size of the array. However, to access the data stored in the array, a predecoder and column decoder may be disposed at either end of a memory array of the memory banks. That is, two predecoders and column decoders (one at each end of the memory array) may be used to reduce a distance between a target memory cell and the column decoder. However, adding a second predecoder and a second column decoder at different locations may increase a physical size of the memory array or reduce storage capabilities. Embodiments disclosed herein provide improved performance and increased speed of a memory access operation compared to conventional memory array architectures.

The embodiments disclosed herein provide a memory array architecture with a column decoder disposed within the memory array. The location of the column decoder may reduce a distance from the column decoder to a target memory cell and thus, reduce a distance that a column select signal travels from the column decoder to the target memory cell. The column decoder may be disposed in the middle of the memory array or offset from the middle near the far edge of the memory array opposite the bank controller. The location of the column decoder enables a reduced array access time to obtain data from the target memory cell. A single predecoder may be disposed in a bank controller of the memory array.

FIG. 1 is a block diagram illustrating some features of a memory device 100. In accordance with some embodiments, the memory device 100 may be a double data rate type five synchronous dynamic random access memory (DDR5 SDRAM) device. Various features of DDR5 SDRAM allow for reduced power consumption, increased bandwidth, and increased storage capacity compared to prior generations of DDR SDRAM. The memory device 100 represents a portion of a single memory chip (e.g., SDRAM chip) having a number of memory banks 102. The memory banks 102 may be, for example, DDR5 SDRAM memory banks. The memory banks 102 may be disposed on one or more chips (e.g., SDRAM chips) arranged on dual inline memory modules (DIMMS). Each DIMM may include a number of SDRAM memory chips (e.g., eight or sixteen memory chips). Each SDRAM memory chip may include one or more memory banks 102.

For DDR5, the memory banks 102 may be arranged to form bank groups. For example, the memory chip may include sixteen memory banks 102 for an eight gigabyte (8 Gb) DDR5 SDRAM. The memory banks 102 may be arranged into eight memory bank groups, each memory bank group including two memory banks. For a sixteen gigabyte (16 Gb) DDR5 SDRAM, the memory chip may include thirty-two memory banks 102, arranged into eight memory bank groups, each memory bank group including four memory banks 102, for instance.

Various other configurations, organizations, and sizes of the memory banks 102 on the memory device 100 may be utilized depending on the application and design of the overall system. In one embodiment, each memory bank 102 includes a bank controller 120, which controls execution of commands to and from the memory banks 102 for performing various functionality in the memory device, such as decoding, timing control, data control, and any combination thereof.

The memory banks 102 may include one or more memory mats 130 in which data is stored. Each memory mat 130 is communicatively coupled to a respective bank controller 120. The bank controller 120 may select a particular memory mat 130 and a column and/or row within the memory mat 130 from which data can be retrieved. The bank controller 120 is discussed in more detail with respect to FIGS. 3A-3C below.

The command interface 104 of the memory device 100 is configured to receive and transmit a number of signals (e.g., signals 106). The signals 106 may be received from an external device (not shown), such as a processor or controller. The processor or controller may provide various signals 106 to the memory device 100 to facilitate transmission and receipt of data to be written to or read from the memory device 100.

As will be appreciated, the command interface 104 may include a number of circuits, such as a clock input circuit (CIC) 108 and a command address input circuit (CAIC) 110, for instance, to ensure proper handling of the signals 106. The command interface 104 may receive one or more clock signals from an external device. Generally, double data rate (DDR) memory utilizes a differential pair of system clock signals, referred to herein as the true clock signal Clk_t and the bar or complimentary clock signal Clk_c. A positive clock edge for DDR refers to the point where a rising true clock signal Clk_t crosses a falling bar clock signal Clk_c. A negative clock edge indicates a transition of a falling true clock signal Clk_t and a rising of the bar clock signal Clk_c. Commands (e.g., read command, write command, etc.) are typically entered on the positive edges of the clock signal. Data may be transmitted or received on both the positive and the negative clock edges.

The clock input circuit 108 receives the true clock signal Clk_t and the bar clock signal Clk_c and generates an internal clock signal, CLK. The internal clock signal CLK is supplied to an internal clock generator, such as a delay locked loop (DLL) circuit 112. The DLL circuit 112 generates a phase controlled internal clock signal LCLK based on the received internal clock signal CLK. The phase controlled internal clock signal LCLK is supplied to the I/O interface 124, for instance, and is used as a timing signal for determining an output timing of read data. In some embodiments, the clock input circuit 108 may include circuitry that splits the clock signal into multiple (e.g., four) phases. The clock input circuit 108 may also include phase detection circuitry to detect which phase receives a first pulse when sets of pulses occur too frequently to enable the clock input circuit 108 to reset between pulses.

The internal clock signal(s)/phases CLK may also be provided to various other components within the memory device 100 and may be used to generate various additional internal clock signals. For instance, the internal clock signal CLK may be provided to a command decoder 114. The command decoder 114 may receive command signals from the command bus 116 and may decode the command signals to provide various internal commands. For instance, the command decoder 114 may provide command signals to the DLL circuit 112 over the bus 118 to coordinate generation of the phase controlled internal clock signal LCLK. The phase controlled internal clock signal LCLK may be used to clock data through the I/O interface 124, for instance.

Further, the command decoder 114 may decode commands, such as read commands, write commands, mode-register set commands, activate commands, etc., and provide access to a particular memory bank 102 corresponding to the command via the bus path 132. As will be appreciated, the memory device 100 may include various other decoders, such as row decoders and column decoders, to facilitate access to the memory banks 102.

The memory device 100 executes operations, such as read and write commands, based on the command/address signals received from an external device, such as a processor. In one embodiment, the command/address bus 116 may be a 14-bit bus to accommodate the command/address signals (CA<13:0>). The command/address signals 106 are clocked to the command interface 104 using the clock signals (Clk_t and Clk_c). The command interface 104 may include a command address input circuit 110 which is configured to receive and transmit the commands to provide access to the memory banks 102 through the command decoder 114. In addition, the command interface 104 may receive a chip select signal (CS_n). The CS_n signal enables the memory device 100 to process commands on the incoming CA<13:0> bus. Access to specific memory banks 102 and/or particular memory mats 130 within the memory device 100 is encoded on the CA<13:0> bus with the commands.

In addition, the command interface 104 may be configured to receive a number of other command signals. For instance, a command/address on die termination (CA_ODT) signal may be provided to facilitate proper impedance matching within the memory device 100. A reset command (RESET_n) may be used to reset the command interface 104, status registers, state machines and the like, during power-up for instance. The command interface 104 may also receive a command/address invert (CAI) signal which may be provided to invert the state of command/address signals CA<13:0> on the command/address bus 116, for instance, depending on the command/address routing for the particular memory device 100. A mirror (MIR) signal may also be provided to facilitate a mirror function. The MIR signal may be used to multiplex signals so the signals can be swapped to enable certain routing of signals to the memory device 100, based on the configuration of multiple memory devices (such as memory device 100) in a particular application. Various signals to facilitate testing of the memory device 100, such as the test enable (TEN) signal, may be provided as well. For instance, the TEN signal may be used to place the memory device 100 into a test mode for connectivity testing.

The command interface 104 may also be used to provide an alert signal (ALERT_n) to the system processor or controller for errors that may be detected. For instance, the alert signal (ALERT_n) may be transmitted from the memory device 100 if a cyclic redundancy check (CRC) error is detected. Other alert signals may also be generated. Further, the bus and pin for transmitting the alert signal (ALERT_n) from the memory device 100 may be used as an input pin during some operations, such as the connectivity test mode executed using the TEN signal, as described above.

Data may be sent to and from the memory device 100, utilizing the command and clocking signals 106 discussed above, by transmitting and receiving data signals 126 through the I/O interface 124. More specifically, the data may be sent to or retrieved from the memory banks 102 over the datapath 122, which includes a plurality of bi-directional data buses. Data I/O signals, generally referred to as DQ signals, are generally transmitted and received on one or more bi-directional data busses. For particular memory devices, such as a DDR5 SDRAM memory device, the I/O signals may be divided into upper and lower bytes. For instance, for a x16 memory device, the I/O signals may be divided into upper and lower I/O signals (e.g., DQ<16:8> and DQ<7:0>) corresponding to upper and lower bytes of the data signals, for instance.

To allow for higher data rates within the memory device 100, some memory devices, such as DDR memory devices may utilize data strobe signals, generally referred to as DQS signals. The DQS signals are driven by the external processor or controller sending the data (e.g., for a write command) or by the memory device 100 (e.g., for a read command). For read commands, the DQS signals are effectively additional data output (DQ) signals with a predetermined pattern. For write commands, the DQS signals may be used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For some memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 100, for instance.

An impedance (ZQ) calibration signal may also be provided to the memory device 100 through the I/O interface 124. The ZQ calibration signal may be provided to a reference pin and used to tune output drivers and ODT values by adjusting pull-up and pull-down resistors of the memory device 100 across changes in process, voltage, and temperature (PVT) values. Because PVT characteristics may affect the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 100 and GND/VSS external to the memory device 100. This resistor acts as a reference for adjusting internal ODT and drive strength of the I/O pins.

In addition, a loopback signal (LOOPBACK) may be provided to the memory device 100 through the I/O interface 124. The loopback signal may be used during a test or debugging phase to set the memory device 100 into a mode wherein signals are looped back through the memory device 100 through the same pin. For instance, the loopback signal may be used to set the memory device 100 to test the data output (DQ) of the memory device 100. Loopback may include both a data and a strobe or possibly just a data pin. This is generally intended to be used to monitor the data captured by the memory device 100 at the I/O interface 124.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 100), etc., may also be incorporated into the memory device 100. Accordingly, it should be understood that the block diagram of FIG. 1 is provided to highlight some functional features of the memory device 100 to aid in the subsequent detailed description. Furthermore, although the foregoing has discussed a DDR5 memory device, the level shifters discussed herein may be used any type of electronic device and/or other types of memory, such as a double-data rate type 4 DRAM (DDR4) memory device.

Figure 2:
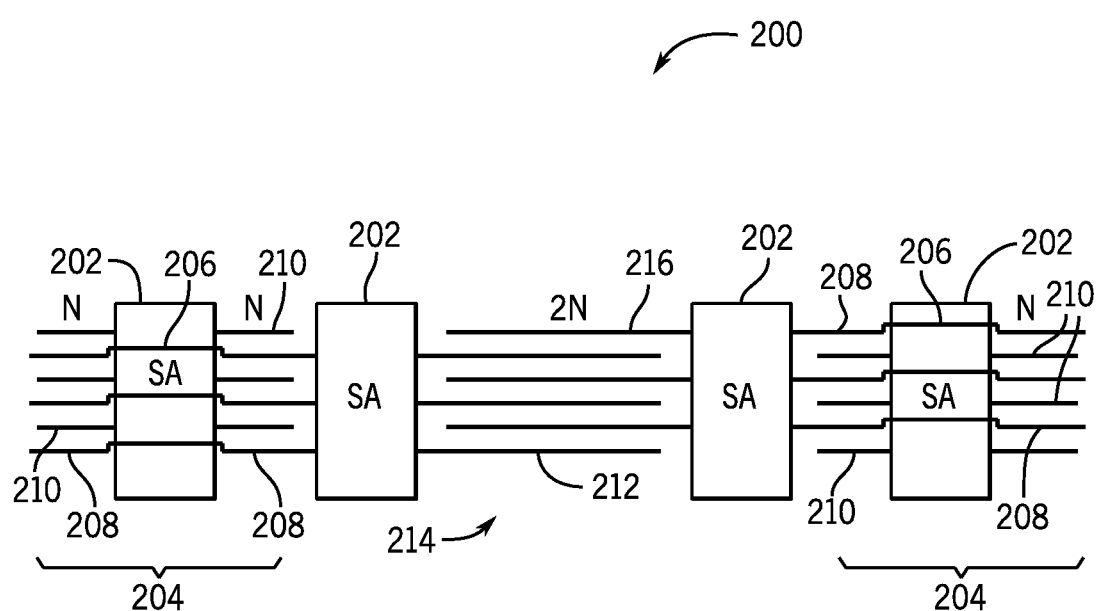
FIG. 2 is a schematic block diagram of a memory architecture for column select operations.

FIG. 2 is a schematic block diagram of a memory architecture 200 for column select operations. As illustrated, the memory architecture 200 includes a bank of sense amplifiers (SA) 202, edge memory mats 204, and an inner memory mat 214 disposed between the edge memory mats 204. As shown, each edge mat 204 may encompass at least one of the sense amplifiers 202. While only one inner memory mat 214 is shown, it should be understood that any number of memory mats 214 may be disposed between the edge memory mats 204. The edge memory mats 204 and the inner memory mat 214 each include one or more memory cells (e.g., memory array) (not shown) disposed between the sense amplifiers 202.

The inner memory mat 214 includes digit lines 212, 216 (e.g., access lines, bitlines, data I/O lines, etc.) coupled to adjacent sense amplifiers 202. The digit lines 212, 216 of the inner memory mat 214 may be split into first digit lines 212 and second digit lines 216. The first digit lines 212 are coupled to a sense amplifier 202 on a first side of the inner memory mat 214 and the second digit lines 216 are coupled to a sense amplifier on a second side of the inner memory mat 214 opposite the first side. The digit lines 212, 216 may also be coupled to respective memory cells of the inner memory mat 214.

The edge memory mats 204 include digit lines 208, 210. The digit lines 210 may be coupled to the respective sense amplifier 202 while respective pairs of the digit lines 208 may be connected via a digit line jumper 206 to form an extended digit line from the edge mat 204 to an adjacent sense amplifier 202. The digit lines 208, 210 may be coupled to respective memory cells of the edge memory mats 204. The digit lines 208 may be interleaved with the digit lines 210. The digit line jumpers 206 may cross the respective sense amplifier 202 such that the corresponding digit lines 208 are not coupled to the sense amplifier 202 of the edge mat 204. Each edge memory mat 204 may include a memory cell (not shown) on either side of the sense amplifier 202. A size of the entire edge memory mat 204 (including both sides of the sense amplifier 202) may be half of a size of the memory cell of the inner memory mat 214.

A length (N) of the individual digit lines 208, 210 (without the digit line jumpers 206) of the edge memory mats 204 may be about half of a length (2N) of the digit lines 212, 216 of the inner memory mat 214. A length of the digit line jumpers 206 may be substantially equal to the length (N) of the digit lines 208, 210. That is, a length of the digit lines 208 of the edge memory mats 204 with the digit line jumpers 206 may be substantially equal to the length of the digit lines 212, 216 of the inner memory mat 214. While six digit lines 208, 210, 212, 216 are depicted, is should be understood that more or fewer digit lines may be used.

Advantageously, the edge memory mats 204 may improve efficient usage of the memory architecture 200 by enabling usage of each memory cell of the edge memory mat 204. That is, by dividing (e.g., splitting) the digit lines 208, 210 of the edge memory mat 204, the outer memory cell positioned outside of the edge memory mat 204 (e.g., opposite the inner memory mat 214) can be accessed and used to store and retrieve data therein. Without the edge memory mat 204, at least half of the outer memory cells would be unused because corresponding digit lines would not be interleaved and the corresponding memory cells could not be accessed. Thus, the edge memory mats 204 enable efficient use of the memory cells of the memory architecture 200.

FIG. 3A is a schematic block diagram of a column select memory architecture 230. The memory architecture 230 includes a plurality of sense amplifiers (SA) 202 disposed between memory mats 244, 246. That is, the sense amplifiers 202 alternate between the memory mats 204. The memory architecture also includes a bank controller 120, a predecoder 234, and a column decoder 240.

The bank controller 120 is disposed at a first end 228 of the memory architecture 230. A second end 229 of the memory architecture 230 is opposite the first end 228 and the bank controller 120. As discussed with respect to FIG. 1, the bank controller 120 may control various functions of the memory architecture 230 such as decoding, timing, data control, and combinations thereof. As illustrated, the bank controller 120 includes a predecoder 234, a data sense amplifier 236, and a column address strobe (CAS) controller 238.

The predecoder 234 may extract or decode an address (e.g., a column address) from an input signal to be used to retrieve data from a memory mat 244, 246. The data sense amplifier 236 may receive low power data signals from a bitline and amplify the data signal to an identifiable logic level to be interpreted by logic circuitry external to the memory architecture 230. The amplified data signal from the data sense amplifier 236 may be provided to the sense amplifiers 202. The CAS controller 238 may receive an input signal and identify a column of a particular memory cell where the address decoded by the predecoder 234 is located. The CAS controller 238 may also validate the column address of the target memory cell. That is, the CAS controller 238 may determine whether the column address of the target memory cell is a valid column address for the corresponding memory architecture. The column decoder 240 may receive the column address from the predecoder 234 and send a column select (CS) signal to a particular memory cell and/or digit line to retrieve or modify data at the particular column address.

The memory architecture 230 includes an edge memory mat 246 at the first end 228 and the second end 229. As illustrated, the edge memory mats 246 do not include a sense amplifier or digit line jumpers like the edge memory mats 204, discussed with respect to FIG. 2. Rather, the edge memory mats 246 may be conventional edge memory mats and include unused memory cells because the corresponding digit lines are not split. Thus, the edge memory mats 246 include memory cells which increase a physical size without increasing storage capacity of the memory architecture 230.

A predecoder 234 and a column decoder 240 may be disposed at the first end 228 and the second end 229 of the memory architecture 230. The dual predecoders 234 and the column decoders 240 reduce a distance that a signal travels from the predecoders 234 and the column decoders 240 travel to reach a target memory cell (e.g., a target column address) in a target memory mat 244. That is, the predecoder 234 and column decoder 240 at the first end 228 may be utilized to access memory cells in the half of the memory architecture closest to the bank controller 120, as indicated by an arrow 222 from the column decoder 240 at the first end 228 to a middle sense amplifier 226. Similarly, the predecoder 234 and column decoder 240 at the second end 229 may be utilized to access memory cells in the half of the memory architecture farthest to the bank controller 120, as indicated by an arrow 220 from the column decoder 240 at the second end 229 to a middle sense amplifier 224. Each arrow 220, 222 corresponds to a column select path for respective sense amplifiers 202 and a length of four memory mats. That is, the distance from the column decoder 240 to a farthest respective sense amplifier 202 is four mats. Reducing the distance from the predecoder 234 and the column decoder 240 to the target memory cell also reduces a time to retrieve or modify data in the target memory mat 244 (e.g., access time) because the column select signal arrives at the respective sense amplifier 202 of the target memory cell sooner.

A time to access a particular memory cell may be measured in memory mats 244, 246. That is, a time to access a memory cell may be based on a distance that one or more signals travel from the bank controller 120 to the target memory cell and a distance that the retrieved data travels back to the bank controller 120. For example, a time to access the memory cell corresponding to the middle sense amplifier 224 includes a distance from the bank controller 120 to the predecoder 234 (and the column decoder 240) at the second end 229 (9 mats), a distance from the column decoder 240 at the second end 229 to the respective sense amplifier 224 (4 mats, indicated by the arrow 220), and a distance from the sense amplifier 224 to the bank controller 120 (5 mats, indicated by the arrow 225). The arrow 225 corresponds to a memory input/output path from the sense amplifier 224 to the data sense amplifier 224. Thus, a maximum access time (and distance) for a target memory cell of the memory architecture 230 is 18 memory mats.

FIG. 3B is a schematic block diagram of a column select memory architecture 250, according to an embodiment of the disclosure. The memory architecture 250 is similar to the memory architecture discussed with respect to FIG. 3A, but includes the edge memory mats 204, as discussed with respect to FIG. 2. The memory architecture 250 also includes the column decoder 240 positioned in a middle of the memory architecture 250. A first half 260 of the memory architecture 250 may be between the column decoder 240 and the first end 228 of the memory architecture 250. A second half 262 of the memory architecture 250 may be between the column decoder 240 and the second end 229 of the memory architecture 250. While the first half 260 and the second half 262 each include two inner memory mats 244, it should be understood that each half 260, 262 could include any number of inner memory mats 244 between the edge memory mats 204.

In some embodiments, as shown, the column decoder 240 may include two column decoders 240. A first column decoder 240 nearest to the first end 228 may be used to access memory cells in the first half 260 of the memory architecture 250, as depicted by a first arrow 254, while a second column decoder 240 nearest the second end 229 may be used to access memory cells in the second half 262 of the of the memory architecture 250, as depicted by a second arrow 252.

As illustrated, edge memory mats 204 are disposed at the first end 228 and the second end 229 of the memory architecture 250 and on either side of the column decoder 240 in the center of the memory architecture 250. As discussed with respect to FIG. 2, the edge memory mats 204 enable a size of the memory architecture 250 to be reduced while allowing access to the memory cells corresponding to the edge memory mats 204. Thus, the edge memory mats 204 increase a storage density while maintaining or reducing a size of the memory architecture 250. Further, utilizing the edge memory mats 204 allows a single predecoder 234 to be disposed in the bank controller 120 and shared by each column decoder 240.

The edge memory mats 204 also reduce a maximum access time (and distance) for a target memory cell. For example, to access target data in a memory cell corresponding to a target sense amplifier 256 at the second end 229 of the memory architecture 250, a predecoder address is sent from the bank controller 120 to the column decoder 240 for the second half of the architecture 250. That is, the predecoder address travels a distance of 4 mats from the predecoder 234 to the column decoder 240.

The column decoder 240 sends a column select (CS) signal to the target sense amplifier 256 to access data at the predecoder address. That is, the CS signal travels a distance of 3.5 mats from the column decoder 240 to the target sense amplifier 256, as depicted by the second arrow 252. A distance the CS signal travels across the edge memory mat 204 at the second end 229 is half of a mat (e.g., 0.5 mats) because the CS signal travels over half 264 of the edge memory mat 204 to the target sense amplifier 256. Once the target data is obtained and/or modified, the target data is sent back to the data sense amplifier of the bank controller 120 at a distance of 7.5 mats as depicted by an arrow 258. Thus, a maximum access time (and distance) for a target memory cell of the memory architecture 250 is 15 memory mats. Accordingly, the edge memory mats 204 enable a reduced access time for the memory architecture 250 while reducing a physical size and increasing a storage density of the memory architecture 250 when compared to the architecture of FIG. 3A.

Figure 3C:
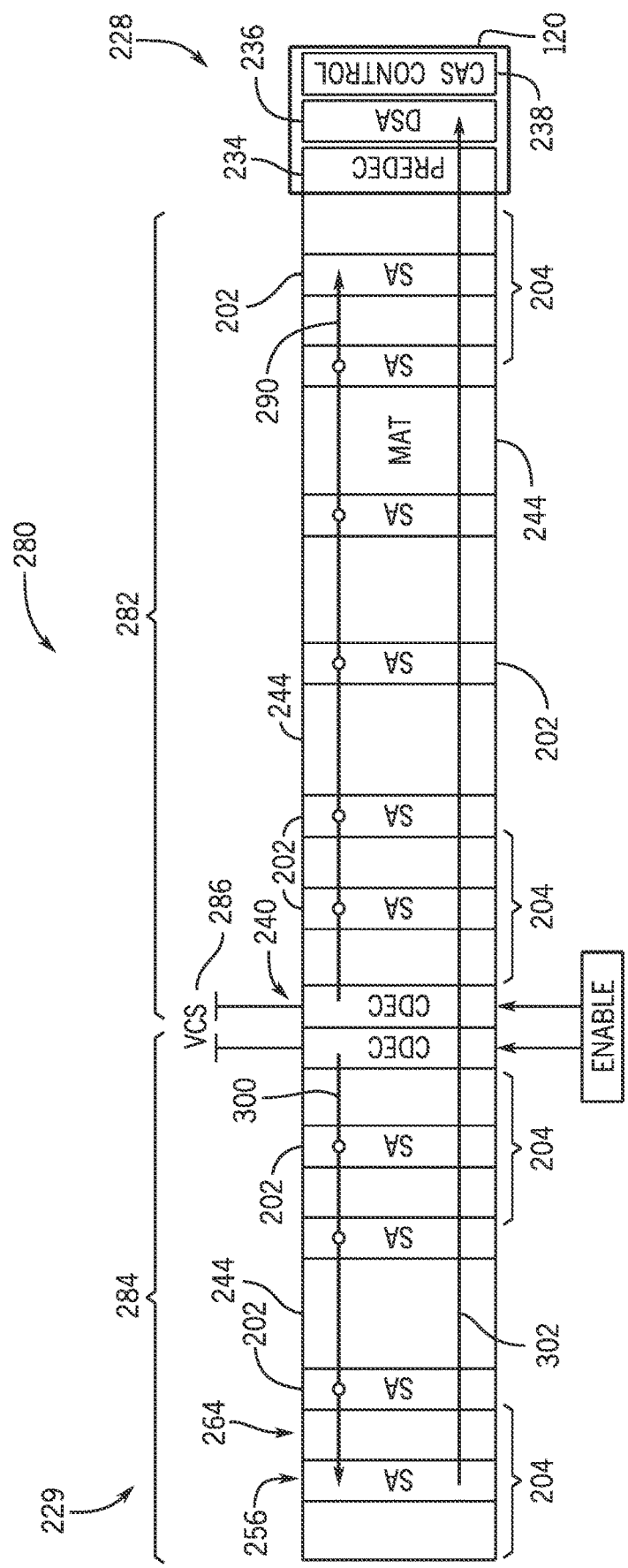
FIG. 3C is a schematic block diagram of a column select memory architecture, according to another embodiment of the disclosure.

FIG. 3C is a schematic block diagram of a column select memory architecture 280, according to another embodiment of the disclosure. The memory architecture 280 is substantially similar to the memory architecture 250 discussed with respect to FIG. 3B. However, a location of the column decoder 240 is biased toward the second end 229 of the memory architecture 280. That is, the column decoder 240 is positioned closer toward the second end 229 of the memory architecture and farther from the bank controller 120.

As shown, a first side 282 of the memory architecture 280 nearest the first end 228 includes two edge memory mats 204 and three inner memory mats 244 while a second side 284 of the memory architecture 280 nearest the second end 229 includes two edge memory mats 204 and one inner memory mats 244. While a maximum access time (and distance) of the memory architecture 280 is the same as the maximum access time (and distance) of the memory architecture 250 discussed with respect to FIG. 3C (e.g., 15 mats), a distance traveled by the CS signal from the column decoder 240 to the edge mat 204 at the second end 229 is reduced by one (1) memory mat. That is, to access a memory cell corresponding to the sense amplifier 256 of the edge mat 204 at the second end 229, the CS signal travels a distance of 2.5 mats from the column decoder 240 to the sense amplifier 256. On the other hand, the predecoder address from the predecoder 234 to the column decoder travels farther, 5 mats compared to 4 mats in FIG. 3B. However, during operation, the CS signal to access all memory mats (e.g., the inner memory mats 244 and the edge memory mats 204) are transmitted over a single column select line (not shown) coupled to each sense amplifier 202. Thus, a load of the column select operation (e.g., sending multiple CS signals from the column decoder 240 to different sense amplifiers 202 concurrently) may be higher than a load of a predecoder operation (e.g., sending a predecoder address from the predecoder 234 to the column decoder 240). The increased load of the column select operation can limit the access speed of the memory architectures 250, 280.

Biasing the position of the column decoder toward the second end of the memory architecture 280 reduces the time and distance that the CS signal travels from the column decoder 240 to target memory mats 204, 244 (and corresponding memory cells) in the second side 284 (e.g., far side) of the memory architecture thereby reducing a load of the column select operation. Accordingly, a location of the column decoder may be moved along the memory architecture 280 (e.g., closer to or farther from the bank controller) to further improve access speed based on the load of the column select operation. The reduced load of the column select operation may also reduce power consumption of an operation to access data in the memory architecture 280.

Figure 4:
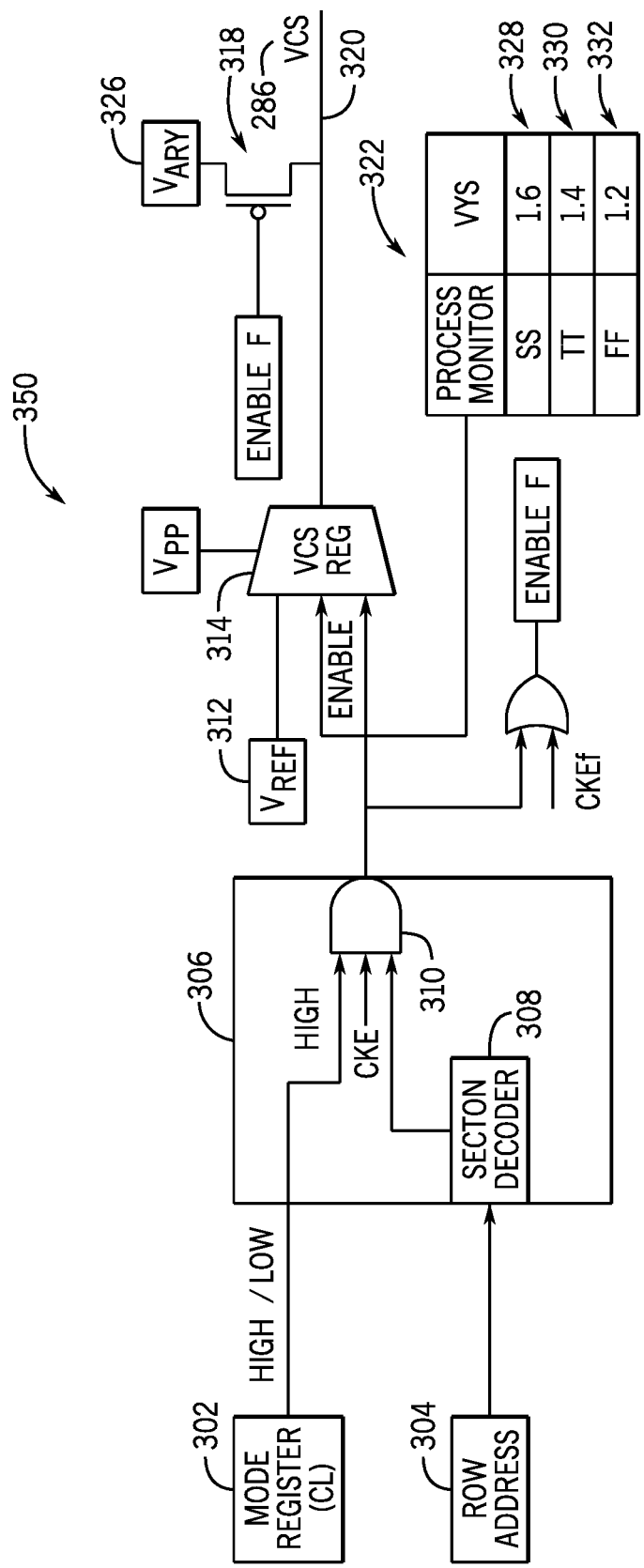
FIG. 4 is a schematic diagram of a column decoder voltage level shifter, according to an embodiment of the disclosure.

In some embodiments, a column select voltage (VCS) 286 may be coupled to the column decoder and used set a voltage level at which the column select operation is performed. The VCS 286 may be adjusted (e.g., increased or decreased) to alter a speed of the column select operation. That is, an increase in the VCS 286 may correspond to an increase in the speed of the column select operation thereby further reducing an access time of the target memory cell. As an example, FIG. 4 is a schematic diagram of a column decoder voltage level shifter 350, according to an embodiment of the disclosure. The level shifter 350 receives various inputs, determines a process corner of the column select operation, and determines a corresponding column select voltage level, VCS 286, for the column decoder.

As illustrated, the level shifter 350 includes an enabling device 306, a multiplexer 314, and a transistor 318. The enabling device includes a section decoder 308 and an AND gate 310. The section decoder 308 may receive the row address 304 (e.g., target address) and determine a section of the memory array (e.g., the memory architecture 250, 280 discussed with respect to FIGS. 3B and 3C) in which the target address is located. An output of the section decoder 308 may indicate a far section of the memory array or a near section of the memory array. The far section may correspond to the second halves 262, 284 and the near section may correspond to the first halves 260, 282, of the memory architectures 250, 280, respectively.

The inputs of the level shifter 350 may include at least the row address 304 of the target memory cell, a column latency 302 (e.g., a delay between a read command and when the data is available), a reference voltage 312, VARY 326 (e.g., a baseline voltage for the column select operation), and the like. The column latency 302 may indicate a speed (e.g., high or low) at which the column select operation is to be performed. In some embodiments, the VARY 326 may be about 1 volt and is the voltage that is adjusted by the level shifter 350.

A process monitor 322 and an output bus 320 are communicatively coupled to the multiplexer. If the section from the section decoder 308 is the near section, the enabling device 306 is not enabled and thus the VARY voltage 326 is provided to the bus 320 as the VCS 286. If the speed at which the column select operation is to be performed is high and the section from the section decoder 308 is the far section, then the enabling device 306 is enabled and the process monitor 322 may determine a voltage level for the column select voltage VCS 286 to be output to the column decoder 240 via the bus 320. The process monitor 322 may determine the voltage level of the VCS 286 based on a process corner (e.g., corner lot) of the level shifter 350. For example, the process monitor 322 may determine if the process corner is fast-fast (FF) 332, typical-typical (TT) 330, or slow-slow (SS) 328. Depending on the process corner, a voltage output (e.g., the VCS 286) of the process monitor 322 may be 1.2 volts for FF, 1.4 volts for TT, and 1.6 volts for SS. Thus, the VCS 286 may be based at least in part on the process corner determined by the process monitor 322. Advantageously, when the speed of the column select operation is high and the section identified by the section decoder 308 is the far section, a higher voltage applied to the bus 320 as the VCS 286 enables an increased speed at which the column select operation is performed.

Figure 5:
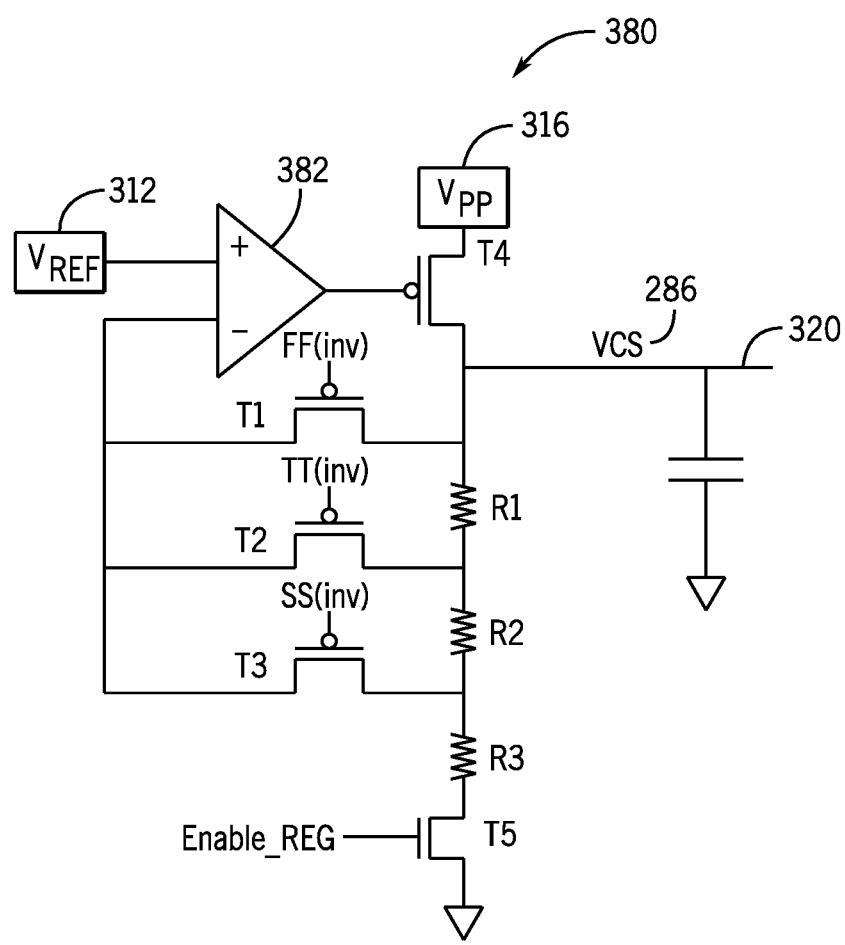
FIG. 5 is an example schematic diagram of a column decoder voltage level shifter for various process corners, according to an embodiment of the disclosure.

FIG. 5 is an example schematic diagram of a portion 380 of the column decoder voltage level shifter 350 for various process corners, according to an embodiment of the disclosure. The portion 380 of the level shifter 350 includes a comparator 382 and a transistor for each of the FF, TT, and SS process corners. For example, a transistor T1 is a p-channel transistor that is turned on (e.g., a logic high is applied to the gate of the transistor T1) for the FF process corner. Similarly, a transistor T2 is turned on for the TT process corner, and a transistor T3 is turned on for the SS process corner. Each of the transistors T1, T2, T3 are coupled to and supply a corresponding voltage level to the comparator 382 which then drives the voltage to the VCS 286 via the bus 320. It should be understood that the portion 380 of the voltage shifter 300 is merely an example and many other circuit arrangements can be used to drive the VCS 286 based at least in part on a process corner.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
a section decoder configured to determine one of a first section and a second section of a memory bank for a location of a target memory cell based on a row address of the target memory cell, wherein a column decoder is disposed between the first section and the second section, and wherein the first section comprises at least two edge memory mats and at least one inner memory mat, and wherein the first section is adjacent to a bank controller of the memory bank; and
a mode register configured to identify a mode of a speed of a column select operation, wherein the mode includes high or low,
and wherein the electronic device is configured to select a voltage level to drive the column decoder based on the mode of the speed and the location of the target memory cell,
and wherein the electronic device is configured to determine a process corner for the column select operation.

2. The electronic device of claim 1, wherein the electronic device is configured to select the voltage level to drive the column decoder from a plurality of levels at least based on the location of the target memory cell is in the second section of the memory bank.

3. The electronic device of claim 1, wherein the electronic device is configured to select the voltage level to drive the column decoder from a plurality of levels at least based on the mode of the speed is high.

4. The electronic device of claim 1, wherein the electronic device is configured to select the voltage level based on the process corner of the column select operation.

5. The electronic device of claim 4, wherein the process corner is at least one of fast-fast, typical-typical, and slow-slow.

6. The electronic device of claim 5, wherein the voltage level of the fast-fast process corner is about 1.2 volts, wherein the voltage level of the typical-typical process corner is about 1.4 volts, and wherein the voltage level of the slow-slow process corner is about 1.6 volts.

7. The electronic device of claim 4, wherein the electronic device is configured to select the voltage level based on the process corner, upon determining that the location of the target memory cell is in the second section and upon determining that the speed of the column select operation is high.

8. The electronic device of claim 1, wherein the electronic device is configured to select the voltage level as a baseline voltage of about 1.0 volts, upon determining that the location of the target memory cell is in the first section or upon determining the mode of the speed of the column select operation is low.

9. The electronic device of claim 1, wherein the electronic device comprises a multiplexer.

10. The electronic device of claim 1, wherein the electronic device comprises a process monitor configured to determine a value of the voltage level to drive the column decoder.

11. A method comprising:
  determining a location of a target memory cell based on a row address of the target memory cell, wherein the location is one of a first section and a second section of a memory bank, wherein a column decoder is disposed between the first section and the second section, and wherein the first section comprises at least two edge memory mats and at least one inner memory mat, and wherein the first section is adjacent to a bank controller of the memory bank;
  identifying a mode of a speed of a column select operation to be performed on the column decoder, wherein the mode includes high or low;
  determining a process corner for the column select operation; and
  selecting a voltage level to drive the column decoder based on the mode of the speed and the location of the target memory cell.

12. The method of claim 11, wherein the selecting the voltage level is based on the process corner of the column select operation.

13. The method of claim 12, wherein the selecting the voltage level is via a process monitor configured to determine a value of the voltage level to drive the column decoder, based on the process corner of the column select operation.

14. The method of claim 13, wherein the process monitor is communicatively coupled to a multiplexer to output the voltage level.

15. A method comprising:
  determining a process corner of a column select operation;
  identifying a voltage level corresponding to the process corner; and
  driving a column decoder via the voltage level, wherein the column decoder is disposed between a first section of a memory bank and a second section of the memory bank, wherein the first section comprises at least two edge memory mats and at least one inner memory mat, and wherein the first section is adjacent to a bank controller of the memory bank.

16. The method of claim 15, wherein the process corner is at least one of fast-fast, typical-typical, and slow-slow.

17. The method of claim 16, wherein the voltage level of the fast-fast process corner is about 1.2 volts, wherein the voltage level of the typical-typical process corner is about 1.4 volts, and wherein the voltage level of the slow-slow process corner is about 1.6 volts.

18. The method of claim 15, comprising:
  identifying a location of a target memory cell based on a row address of the target memory cell; and
  identifying a mode of a speed of the column select operation, wherein the mode includes high or low.

19. The method of claim 18, comprising, upon determining that the location of the target memory cell is in the first section or upon determining the speed of the column select operation is low, driving the column decoder with a baseline voltage of about 1.0 volts.

20. The method of claim 18, comprising, upon determining that the location of the target memory cell is in the second section and upon determining that the speed of the column select operation is high, driving the column decoder with the voltage level based on the process corner.

* * * * *